United States Patent
Kurd et al.

(10) Patent No.: US 8,736,328 B2
(45) Date of Patent: May 27, 2014

(54) LOW POWER, JITTER AND LATENCY CLOCKING WITH COMMON REFERENCE CLOCK SIGNALS FOR ON-PACKAGE INPUT/OUTPUT INTERFACES

(75) Inventors: Nasser A. Kurd, Portland, OR (US); Thomas P. Thomas, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/994,808

(22) PCT Filed: Dec. 22, 2011

(86) PCT No.: PCT/US2011/066990
§ 371 (c)(1),
(2), (4) Date: Jun. 17, 2013

(87) PCT Pub. No.: WO2013/095549
PCT Pub. Date: Jun. 27, 2013

(65) Prior Publication Data
US 2013/0300475 A1    Nov. 14, 2013

(51) Int. Cl.
*H03L 7/06*    (2006.01)
(52) U.S. Cl.
USPC .......................................... 327/158; 327/147
(58) Field of Classification Search
CPC ........ H03I 7/0814; H03I 7/0812; G11C 7/222
USPC .................................. 327/149, 158
See application file for complete search history.

(56) References Cited

U.S. PATENT DOCUMENTS

| | | | | |
|---|---|---|---|---|
| 6,016,080 A | * | 1/2000 | Zuta et al. | 331/25 |
| 6,545,550 B1 | * | 4/2003 | Frerking | 331/44 |
| 6,611,755 B1 | * | 8/2003 | Coffee et al. | 701/482 |
| 7,884,655 B2 | * | 2/2011 | Marton et al. | 327/156 |
| 8,547,151 B2 | * | 10/2013 | Kuo et al. | 327/156 |
| 2010/0123490 A1 | * | 5/2010 | Marton et al. | 327/156 |
| 2010/0148932 A1 | * | 6/2010 | Oakes | 340/10.2 |
| 2010/0166058 A1 | * | 7/2010 | Perlman et al. | 375/240.02 |
| 2013/0135018 A1 | * | 5/2013 | Kuo et al. | 327/157 |
| 2013/0300475 A1 | * | 11/2013 | Kurd et al. | 327/158 |
| 2013/0326205 A1 | * | 12/2013 | Kulick et al. | 713/1 |

* cited by examiner

*Primary Examiner* — Adam Houston
(74) *Attorney, Agent, or Firm* — Blakely, Sokoloff, Taylor & Zafman LLP

(57) ABSTRACT

Low power, jitter and latency clocking with common reference clock signals for on-package input/output interfaces. A filter phase locked loop circuit in a master device on a first die provides a clock signal having a frequency of 2F. A local phase locked loop circuit in the master device on the first die is coupled with the filter phase locked loop to provide a clock signal to functional components of the master device through a local clock divider circuit to provide a clock signal of F to the functional components. A remote phase locked loop circuit in a slave device on a second die is coupled with the filter phase locked loop to provide a clock signal to one or more functional components of the slave device through a local clock divider circuit to provide a clock signal of F to the functional components.

18 Claims, 4 Drawing Sheets

LOW POWER, JITTER AND LATENCY CLOCKING WITH COMMON REFERENCE CLOCK SIGNALS FOR ON-PACKAGE INPUT/OUTPUT INTERFACES

TECHNICAL FIELD

Embodiments of the invention relate to input/output architectures and interfaces. More particularly, embodiments of the invention relate to high-bandwidth on-package input/output architectures and interfaces.

BACKGROUND

High bandwidth interconnections between chips using conventional input/output (I/O) interfaces require significant power and chip area. Thus, in applications requiring significantly reduced power consumption and/or smaller chip area, these conventional interfaces are not desirable.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Figure 1:
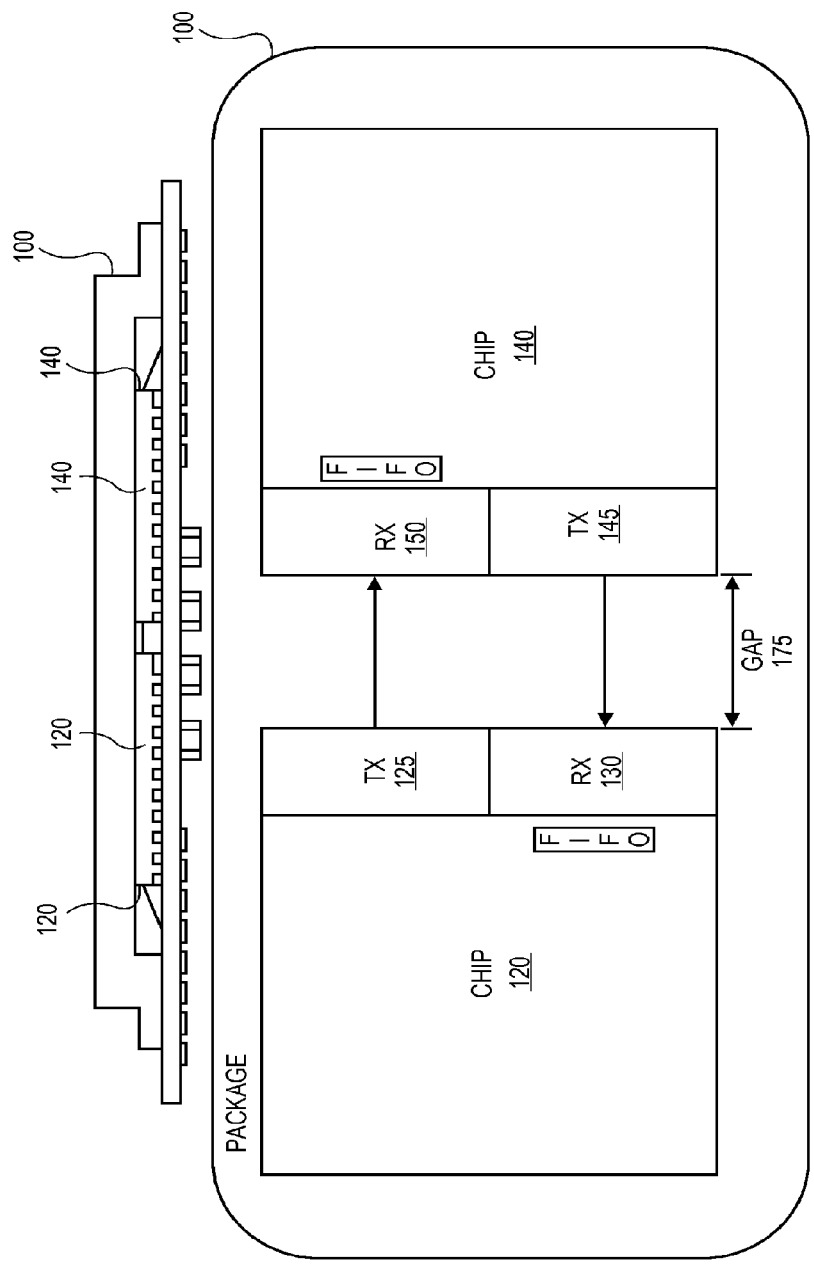
FIG. 1 is a block diagram of one embodiment of a multi-chip package (MCP) having on-package input/output (OPIO) interfaces between at least two chips.

FIG. 1 is a block diagram of one embodiment of a multi-chip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips, graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130.

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 1.5 mm. In other embodiments, gap 175 may be less than 1.5 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal is transmitted for a cluster of signals. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, use of a CMOS transmitter and receiver with no or weak receiver termination and no equalization can reduce I/O power. Simplified clocking with one forwarded clock per cluster of signals and no per pin de-skew can be achieved due to careful length matched routing reduces clock power. Thus, the architectures described herein provide high bandwidth between chips at very low power, area and latency.

The architectures described herein can also be extended to close discrete packages with full ESD protection for small form factor mobile applications at lower data rates. Multi-level (e.g., M-PAM) signaling can be used at higher data rates to keep the clock frequency down.

Figure 2:
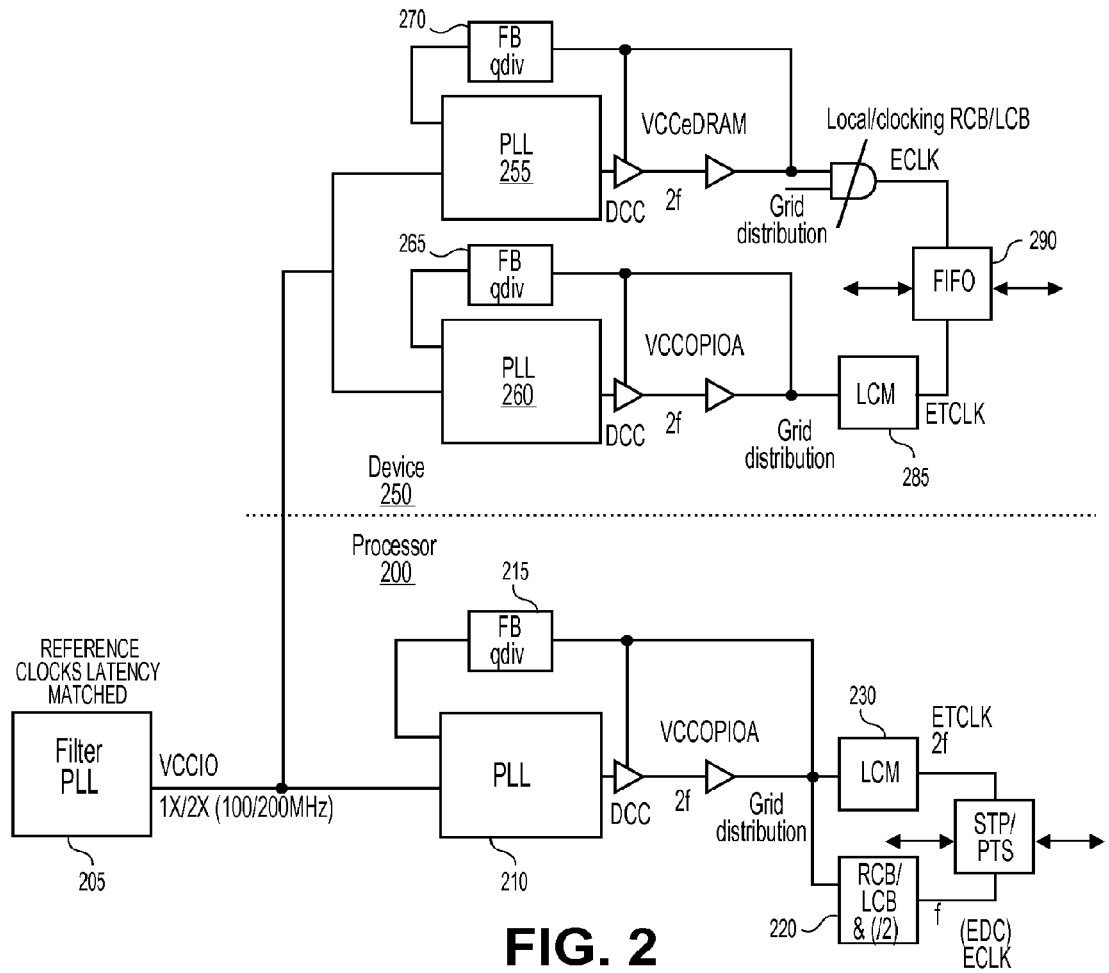
FIG. 2 illustrates one embodiment of a clocking architecture that may be utilized, for example, with the OPIO interface of FIG. 1.

FIG. 2 illustrates one embodiment of a clocking architecture that may be utilized, for example, with the OPIO interface of FIG. 1. The clocking architecture of FIG. 2 may provide a low-power deterministic coincident forwarded clocking signal with improved performance and lower round trip latency and lower inaccuracies that may enable faster I/O rates. Continuous tracking may also support voltage and temperature compensation.

Filter phase locked loop (PLL) 205 in processor 200 operates to generate one or more higher-frequency common reference clock signals that may be distributed and matched to processor and/or device PLLs. In one embodiment, filter PLL 205 generates 100 MHz and 200 MHz clock signals; however, any clock signal frequency may be supported.

In one embodiment, within processor 200, I/O PLL 210 is used to clock both the I/O analog front end (AFE) as well as the controller. In one embodiment, the clock signal generated and distributed is a single-ended signal and matched at twice the operating frequency (e.g., 2F, where F represents the frequency). In one embodiment, the AFE, local clock macro (LCM) 230 converts the single ended clock signal to a differential (SED) signal.

The signal from filter PLL 205 is provided to OPIO PLL 210 for distribution within processor 200. In one embodiment, filter PLL 205 generates higher frequency common reference clock signals (e.g., 100 MHz and 200 MHz) that are distributed and matched to processor PLL 210 and device PLL 260. In one embodiment, PLL 210 receives a divided clock signal provided by feedback divider 215.

In one embodiment, in processor 200, PLL 210 provides a clock signal to the input/output (I/O) analog front end (AFE) as well as the controller. The clock signals may be provided through, for example, regional clock buffer (RCB) and/or local clock buffer (LCB) 220

Figure 3:
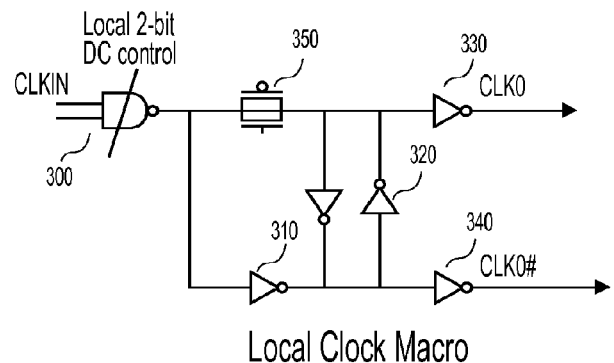
FIG. 3 illustrates one embodiment of a circuit for providing a local clock signal.

In one embodiment, the clock frequency generated is distributed over a single-ended network and is matched at 2F, where F is the local clock frequency. In one embodiment, at the AFE, a local clock macro (LCM) 230 converts the singled-ended clock signal to a differential clock signal (SED). One embodiment of a LCM is illustrated in FIG. 3.

In one embodiment, the I/O interface at the parallel in/serial out (PISO, not shown) uses the clock and clock# signals to serialize data at full data rate. Clock distribution may be matched and at the end of the distribution network, the clock signal is fed back to the PLL as well as to the duty cycle correction circuit (may be at the output of the PLL) to provide a 50% duty cycle as sensed at the end of the distribution.

The controller in the processor, at the local level, may divide the 2F clock signal to a F clock signal (e.g., from 4 GHz to 2 GHz) to drive the controller logic. Given the same PLL and clock distribution may be used, no special buffer crossing is required at the transmit side between the AFE and the controller.

In device 250 (e.g., DRAM, eDRAM, WideIO DRAM), multiple PLLs (e.g., 255, 260) may be used to provide clock signals to the functional elements (e.g., memory array) and AFE, referencing the clock signal (e.g., 2F clock signal and/or F clock signal) sent from processor 200. In one embodiment, PLL 255 is dedicated to the memory, which has a relatively long clock distribution latency. LCM 230 operates to convert the single-ended clock signal to a differential clock signal.

In one embodiment, similar to processor 200, PLL 255 is configured with its distribution in the loop with DCC at the output of PLL 255. In one embodiment, PLL 255 runs at the base frequency (i.e., F). PLL 260 is dedicated to the AFE with a much shorter clock distribution latency and is also configured similar to the other PLL and generates a 2F clock signal. In one embodiment, buffer 290 provides a mechanism to send and receive data from another device, for example, to hold data to be stored in memory and to hold data read from memory to be transmitted to another chip. In one embodiment, PLL 255 receives a divided clock signal provided by feedback divider 270 and PLL 260 receives a divided clock signal provided by feedback divider 265.

Separating AFE and memory PLLs allows accurate low jitter clock signals for the AFE and also to minimize complexity given the AFE and memory are powered from different power rails. At the die crossing, a low latency buffer may be used to compensate for PLL and voltage drifts.

FIG. 3 illustrates one embodiment of a circuit for providing a local clock signal. The example of FIG. 3 is one example of a circuit that may be used to convert a single-ended clock signal to a differential clock signal to be used as described herein. Logic gate 300, transistors 350 and inverters 310, 320, 330 and 340 may be arranged to provide the differential clock signals. Other conversion mechanisms may also be used.

Figure 4:
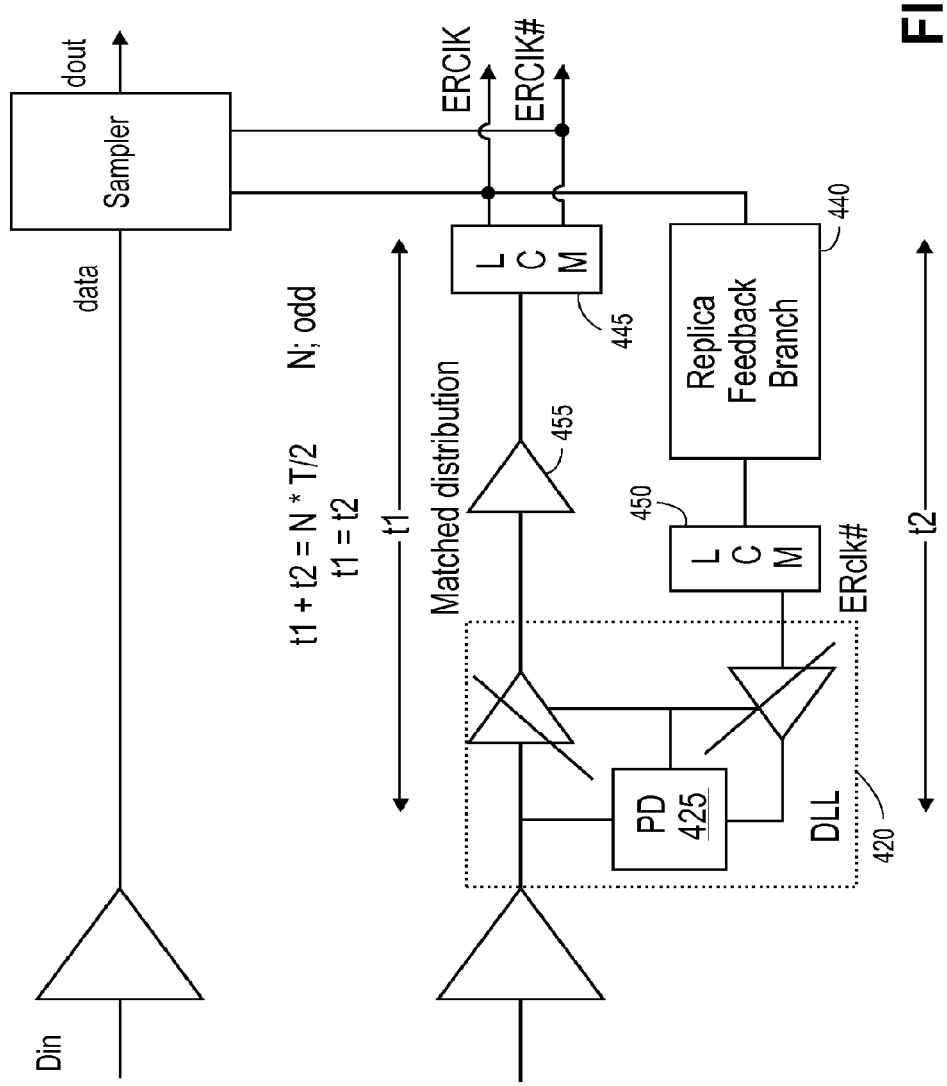
FIG. 4 illustrates one embodiment of a matched and gridded receiver clock architecture.

FIG. 4 illustrates one embodiment of a matched and gridded receiver clock architecture. At the receiver, the forwarded clock signal (sent from the transmitter with the data) is received by the delay locked loop (DLL). The DLL output is distributed to the data lanes (e.g., 16 data lanes, but any number may be supported).

The clock signal may be distributed in a single-ended, matched manner and at the local level to be converted to differential signal using a similar SED structure and used to sample the incoming data then the output is sent to the serial in/parallel out (SIPO) to parallelize the received data (not shown). The DLL and distribution and replica feedback provide a total of 180 degrees out of which 90 in forward delay and 90 in the replica ensuring data is sampled in the middle of the data eye continuously providing constant voltage and temperature tracking.

Leveraging filter PLLs in the processor, with its output at a higher reference clock frequency as a common clock, reference matched between two chips (e.g., processor and memory) provides a unique clock interface clocking solution. The higher reference clock frequency enables higher PLL bandwidth and thus reduces long term PLL jitter (and reduces PLL lock time further improving power efficiency).

Higher reference clock frequency contributes to less skew that may require compensation by a buffer, which reduces total round trip loop latency. Matching the reference clocks further minimizes the buffer depth. A more efficient clocking system may be provided with one or more of the following: distributing clock signals single-endedly (reduces power) using shallow clock distribution powered by cleaner power supplies with local conversion from single ended to differential (lower power), integrating duty cycle at the output of the PLL sensing end of clock distribution, locking the PLL with distribution in the PLL loop ensuring deterministic interfaces.

In one embodiment, at the receiver side, one DLL is shared with multiple (e.g., 16, 32) data lanes where the distribution loop consists of an adjustable delay line, matched clock distribution, replica delay line, providing 180 degree phase shift out of which 90 degrees is in the adjustable delay and distribution.

In one embodiment, phase detector 425, LCM 450, amplifier 455 and replica feedback branch 440 operate to provide a delay locked loop (DLL) functionality. LCM 445 provides a differential clock signal from the single-ended clock signal received from the DLL. In one embodiment, when one or more PLLs are powered down, DLL 420 remains locked, which results in a more efficient power utilization. In one embodiment, the distribution length corresponding to $t_1$ in FIG. 4 is 90 degrees and the distribution length corresponding to $t_2$ is also 90 degrees.

Figure 5:
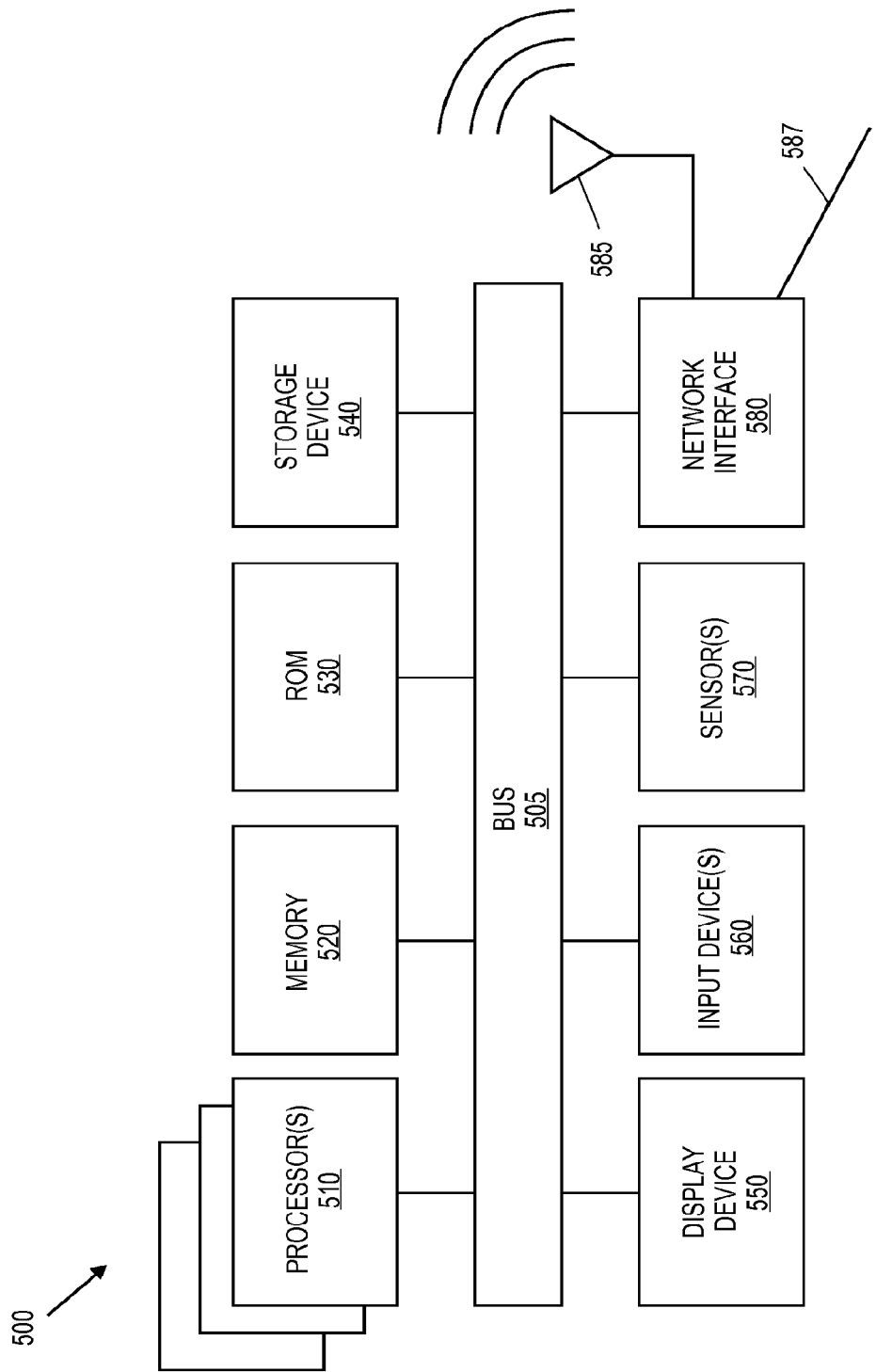
FIG. 5 is a block diagram of one embodiment of an electronic system.

FIG. 5 is a block diagram of one embodiment of an electronic system. The electronic system illustrated in FIG. 5 is intended to represent a range of electronic systems (either wired or wireless) including, for example, a tablet device, a smartphone, a desktop computer system, a laptop computer system, a server etc. Alternative electronic systems may include more, fewer and/or different components.

One or more of the components illustrated in FIG. 5 may be interconnected utilizing the OPIO architectures described herein. For example, multiple processor chips may be interconnected, or a processor and a cache memory or dynamic random access memory, etc.

Electronic system 500 includes bus 505 or other communication device to communicate information, and processor(s) 510 coupled to bus 505 that may process information. Electronic system 500 may include multiple processors and/or co-processors. Electronic system 500 further may include random access memory (RAM) or other dynamic storage device 520 (referred to as memory), coupled to bus 505 and may store information and instructions that may be executed by processor 510. Memory 520 may also be used to store temporary variables or other intermediate information during execution of instructions by processor(s) 510.

Electronic system 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled to electronic system 500.

Electronic system 500 may also be coupled via bus 505 to display device 550, which can be any type of display device, to display information to a user, for example, a touch screen. Input device 560 may be any type of interface and/or device to allow a user to provide input to electronic system 500. Input device may include hard buttons and/or soft buttons, voice or speaker input, to communicate information and command selections to processor(s) 510.

Electronic system 500 may further include sensors 570 that may be used to support functionality provided by Electronic system 500. Sensors 570 may include, for example, a gyroscope, a proximity sensor, a light sensor, etc. Any number of sensors and sensor types may be supported.

Electronic system 500 further may include network interface(s) 580 to provide access to a network, such as a local area network. Network interface(s) 580 may include, for example, a wireless network interface having antenna 585, which may represent one or more antenna(e). Network interface(s) 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface(s) 580 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 5: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
a filter phase locked loop circuit in a master device on a first die, the phase locked loop providing a clock signal of 2F;
a local phase locked loop circuit in the master device on the first die coupled with the filter phase locked loop, the local phase locked loop circuit to provide a clock signal to one or more functional components of the master device through a local clock divider circuit to provide a clock signal of F to the functional components; and
a remote phase locked loop circuit in a slave device on a second die coupled with the filter phase locked loop, the remote phase locked loop circuit to provide a clock signal to one or more functional components of the slave device through a local clock divider circuit to provide a clock signal of F to the functional components.

2. The apparatus of claim 1 further comprising:
a first set of single-ended transmitter circuits on the first die to transmit the clock signal of 2F, wherein the transmitter circuits are impedance matched and have no equalization;
a first set of single-ended receiver circuits on a second die coupled with the first set of single-ended transmitter circuits, wherein the receiver circuits have no termination and no equalization; and
a plurality of conductive lines between the first set of transmitter circuits and the first set of receiver circuits, wherein the lengths of the plurality of conductive lines are matched.

3. The apparatus of claim 2 further comprising:
a second set of single-ended receiver circuits on the first die, wherein the receiver circuits have no termination and no equalization;
a second set of single-ended transmitter circuits on the second die coupled with the second set of single-ended receiver circuits, wherein the transmitter circuits are impedance matched and have no equalization; and
a plurality of conductive lines between the second set of transmitter circuits and the second set of receiver circuits, wherein the lengths of the plurality of conductive lines are matched.

4. The apparatus of claim 1 wherein the matched clock distribution path is adjustable.

5. The apparatus of claim 2 wherein a forwarded clock signal is transmitted with a cluster of N data signals; and
a delay locked loop circuit with a cluster of N data signal receivers is coupled with the forwarded clock signal, the delay locked loop circuit to remain locked to the forwarded clock signal, to provide a matched distribution path that is at 90 degree phase of the clock signal.

6. The apparatus of claim 5 wherein an outbound clock distribution path provides a 90 degree phase shift and in inbound clock distribution path provides a 90 degree phase shift in the receiver cluster.

7. A tablet computing device comprising:
a touch screen interface;
a filter phase locked loop circuit in a master device on a first die, the phase locked loop providing a clock signal of 2F;
a local phase locked loop circuit in the master device on the first die coupled with the filter phase locked loop, the local phase locked loop circuit to provide a clock signal to one or more functional components of the master device through a local clock divider circuit to provide a clock signal of F to the functional components; and
a remote phase locked loop circuit in a slave device on a second die coupled with the filter phase locked loop, the remote phase locked loop circuit to provide a clock signal to one or more functional components of the slave device through a local clock divider circuit to provide a clock signal of F to the functional components.

8. The tablet of claim 7 further comprising:
a first set of single-ended transmitter circuits on the first die to transmit the clock signal of 2F, wherein the transmitter circuits are impedance matched and have no equalization;
a first set of single-ended receiver circuits on a second die coupled with the first set of single-ended transmitter circuits, wherein the receiver circuits have no termination and no equalization; and
a plurality of conductive lines between the first set of transmitter circuits and the first set of receiver circuits, wherein the lengths of the plurality of conductive lines are matched.

9. The tablet of claim 8 further comprising:
a second set of single-ended receiver circuits on the first die, wherein the receiver circuits have no termination and no equalization;
a second set of single-ended transmitter circuits on the second die coupled with the second set of single-ended receiver circuits, wherein the transmitter circuits are impedance matched and have no equalization; and
a plurality of conductive lines between the second set of transmitter circuits and the second set of receiver circuits, wherein the lengths of the plurality of conductive lines are matched.

10. The tablet of claim 7 wherein the matched clock distribution path is adjustable.

11. The tablet of claim 8 wherein a forwarded clock signal is transmitted with a cluster of N data signals; and
a delay locked loop circuit with a cluster of N data signal receivers is coupled with the forwarded clock signal, the delay locked loop circuit to remain locked to the forwarded clock signal, to provide a matched distribution path that is at 90 degree phase of the clock signal.

12. The tablet of claim 11 wherein an outbound clock distribution path provides a 90 degree phase shift and in inbound clock distribution path provides a 90 degree phase shift in the receiver cluster.

13. A system comprising:
an omnidirectional antenna;
a filter phase locked loop circuit in a master device on a first die, the phase locked loop providing a clock signal of 2F;
a local phase locked loop circuit in the master device on the first die coupled with the filter phase locked loop, the local phase locked loop circuit to provide a clock signal to one or more functional components of the master device through a local clock divider circuit to provide a clock signal of F to the functional components; and
a remote phase locked loop circuit in a slave device on a second die coupled with the filter phase locked loop, the remote phase locked loop circuit to provide a clock signal to one or more functional components of the slave device through a local clock divider circuit to provide a clock signal of F to the functional components.

14. The system of claim 13 further comprising:
a first set of single-ended transmitter circuits on the first die to transmit the clock signal of 2F, wherein the transmitter circuits are impedance matched and have no equalization;
a first set of single-ended receiver circuits on a second die coupled with the first set of single-ended transmitter circuits, wherein the receiver circuits have no termination and no equalization; and
a plurality of conductive lines between the first set of transmitter circuits and the first set of receiver circuits, wherein the lengths of the plurality of conductive lines are matched.

15. The system of claim 14 further comprising:
a second set of single-ended receiver circuits on the first die, wherein the receiver circuits have no termination and no equalization;
a second set of single-ended transmitter circuits on the second die coupled with the second set of single-ended receiver circuits, wherein the transmitter circuits are impedance matched and have no equalization; and
a plurality of conductive lines between the second set of transmitter circuits and the second set of receiver circuits, wherein the lengths of the plurality of conductive lines are matched.

16. The system of claim 13 wherein the matched clock distribution path is adjustable.

17. The system of claim 14 wherein a forwarded clock signal is transmitted with a cluster of N data signals; and
a delay locked loop circuit with a cluster of N data signal receivers is coupled with the forwarded clock signal, the delay locked loop circuit to remain locked to the forwarded clock signal, to provide a matched distribution path that is at 90 degree phase of the clock signal.

18. The system of claim 17 wherein an outbound clock distribution path provides a 90 degree phase shift and in inbound clock distribution path provides a 90 degree phase shift in the receiver cluster.

* * * * *